United States Patent
Qi et al.

(10) Patent No.: US 9,484,393 B2
(45) Date of Patent: Nov. 1, 2016

(54) ARRAY SUBSTRATE OF A DISPLAY DEVICE, MANUFACTURING METHOD THEREOF

(71) Applicant: BOE TECHNOLOGY GROUP CO., LTD., Beijing (CN)

(72) Inventors: Yonglian Qi, Beijing (CN); Shi Shu, Beijing (CN); Ming Zhao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/428,563

(22) PCT Filed: May 26, 2014

(86) PCT No.: PCT/CN2014/078454
§ 371 (c)(1),
(2) Date: Mar. 16, 2015

(87) PCT Pub. No.: WO2015/096378
PCT Pub. Date: Jul. 2, 2015

(65) Prior Publication Data
US 2016/0027852 A1    Jan. 28, 2016

(30) Foreign Application Priority Data
Dec. 27, 2013  (CN) .......................... 2013 1 0741375

(51) Int. Cl.
*H01L 27/32* (2006.01)
*H01L 27/12* (2006.01)
(Continued)

(52) U.S. Cl.
CPC ......... *H01L 27/3248* (2013.01); *H01L 27/124* (2013.01); *H01L 27/322* (2013.01); *H01L 27/3246* (2013.01); *H01L 51/5206* (2013.01);
(Continued)

(58) Field of Classification Search
CPC .......... H01L 27/3248; H01L 51/5284; H01L 51/5253; H01L 27/322; H01L 51/56; H01L 27/3246; H01L 2227/323
See application file for complete search history.

(56) References Cited

U.S. PATENT DOCUMENTS

2004/0082195 A1* 4/2004 Yudasaka .............. H01L 21/288
                                                              438/782
2015/0340416 A1* 11/2015 Qi .......................... H01L 21/77
                                                              257/40

FOREIGN PATENT DOCUMENTS

CN         1579009 A       2/2005
CN       102914922 A       2/2013
(Continued)

OTHER PUBLICATIONS

Sep. 11, 2015—(CN)—First Office Action Appn 201310741375.9 with Eng Tran.

(Continued)

*Primary Examiner* — John P Dulka
(74) *Attorney, Agent, or Firm* — Banner & Witcoff, Ltd.

(57) ABSTRACT

An array substrate, a manufacturing method thereof and a display device are disclosed. The array substrate comprises a base substrate and a thin-film transistor (TFT) unit, a color filter and a planarization protective layer disposed on the base substrate. The planarization protective layer is electrically connected with a drain electrode of the TFT unit and is conductive. The array substrate has the advantages of simplifying the layer structures of the array substrate, reducing the manufacturing difficulty of the array substrate, and improving the production yield of the array substrate.

18 Claims, 6 Drawing Sheets

(51) Int. Cl.
*H01L 51/52* (2006.01)
*H01L 51/56* (2006.01)

(52) U.S. Cl.
CPC ....... *H01L 51/5209* (2013.01); *H01L 51/5253* (2013.01); *H01L 51/56* (2013.01); *H01L 27/3272* (2013.01); *H01L 51/5284* (2013.01); *H01L 2227/323* (2013.01)

(56) References Cited

FOREIGN PATENT DOCUMENTS

| | | | | |
|---|---|---|---|---|
| CN | 103353683 A | * | 10/2013 | ....... G02F 1/134309 |
| CN | 103646852 A | | 3/2014 | |
| CN | 103681693 A | | 3/2014 | |
| CN | 103700674 A | | 4/2014 | |
| CN | 103779360 A | | 5/2014 | |
| JP | 2012108168 | | 6/2012 | |
| KR | 20130135547 A | | 12/2013 | |

OTHER PUBLICATIONS

Oct. 14, 2014—(CN) International Search Report for PCT/CN2014/078454.

Oct. 14, 2014—(CN) Written Opinion for PCT/CN2014/078454—Eng Trans.

* cited by examiner

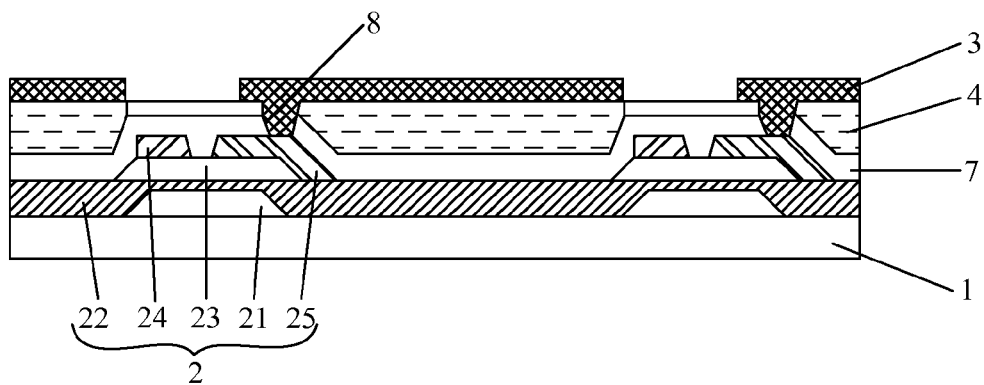

FIG. 17

| |
|---|
| forming a second insulating layer on the planarization protective layer, in which the second insulating layer is provided with an opening so that the organic layer is electrically connected with the planarization protective layer through the opening — S301 |

↓

| |
|---|
| forming an organic layer on the formed planarization protective layer and forming a conductive layer on the organic layer, so that the planarization protective layer can be electrically connected with the organic layer and cooperate with the conductive layer to jointly drive the organic layer to emit light — S302 |

FIG. 18

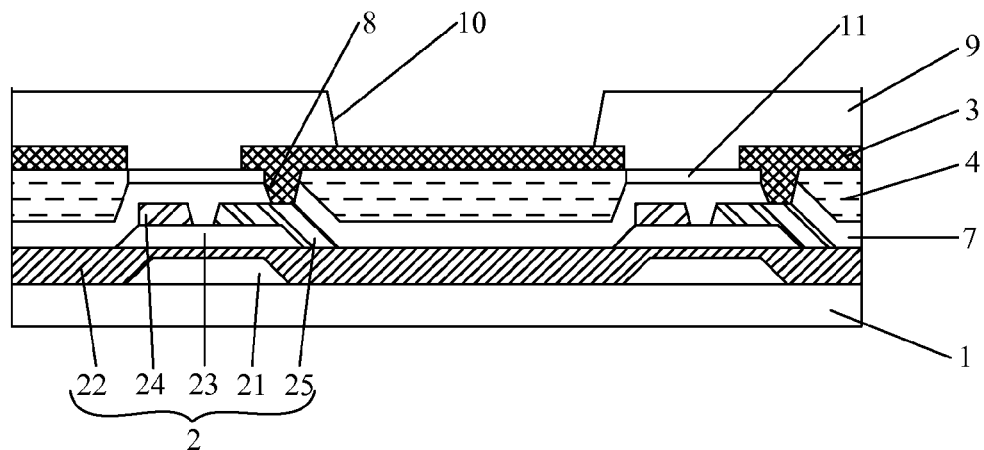

FIG. 19

ARRAY SUBSTRATE OF A DISPLAY DEVICE, MANUFACTURING METHOD THEREOF

The application is a U.S. National Phase Entry of International Application No. PCT/CN2014/078454 filed on May 26, 2014, designating the United States of America and claiming priority to Chinese Patent Application No. 201310741375.9 filed on Dec. 27, 2013. The present application claims priority to and the benefit of the above-identified applications and the above-identified applications are incorporated by reference herein in their entirety.

TECHNICAL FIELD

Embodiments of the present invention relate to an array substrate, a manufacturing method thereof and a display device.

BACKGROUND

Organic light-emitting diode (OLED) is an organic thin-film electroluminescent device and has the advantages of simple manufacturing process, low cost, high luminous efficiency, easily formed flexible structure, wide viewing angle and the like. Thus, the display technology employing OLED has become an important display technology.

SUMMARY

At least one embodiment of the present invention provides an array substrate, a manufacturing method thereof and a display device, which can effectively ensure safety and improve productivity.

At least one embodiment of the present invention provides an array substrate, which comprises a base substrate and a TFT unit, a color filter and a planarization protective layer disposed on the base substrate. The planarization protective layer is electrically connected with a drain electrode of the TFT unit, and the planarization protective layer is conductive.

At least one embodiment of the present invention provides a display device, which comprises the foregoing array substrate.

At least one embodiment of the present invention provides a method for manufacturing an array substrate. The manufacturing method comprises: forming a TFT unit provided with a drain electrode, a color filter and a planarization protective layer electrically connected with the drain electrode of the TFT unit.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

FIG. 17 is a schematic structural view of an array substrate provided by one embodiment of the present invention;

FIG. 18 is a flowchart of a method for manufacturing an array substrate, provided by one embodiment of the present invention; and FIG. 19 is a schematic structural view of an array substrate provided by one embodiment of the present invention.

REFERENCE NUMERALS OF THE ACCOMPANYING DRAWINGS

1—base substrate; 2—TFT unit; 21—gate electrode; 22—gate insulating layer; 23—active layer; 24—source electrode; 25—drain electrode; 3—planarization protective layer; 4—color filter; 5—organic layer; 6—conductive layer; 7—first insulating layer; 8—first through hole; 9—second insulating layer; 10—opening; 11—black matrix; 12—third insulating layer; 13—fourth insulating layer; 14—common electrode.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

The inventors has found that: in order to avoid line breakage and defect in forming an OLED electrode on a color filter, a planarization protective layer is necessarily disposed between the OLED electrode and the color filter, but the structure is relatively complex, and hence the manufacturing difficulty of the array substrate can be increased and the production yield of the array substrate can be reduced.

Figure 1:
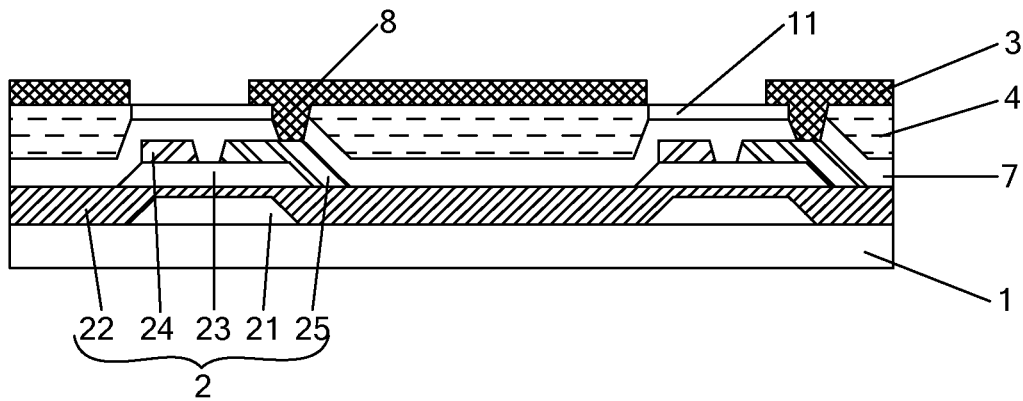
FIG. 1 is a schematic structural view of an array substrate provided by one embodiment of the present invention.

FIG. 1 is a schematic structural view of an array substrate provided by one embodiment of the present invention. At least one embodiment of the present inventions provides an array substrate, which, as illustrated in FIG. 1, comprises a base substrate 1 and TFT units 2, color filters 4 and planarization protective layers 3 disposed on the base substrate 1. A planarization protective layer 3 is electrically connected with a drain electrode 25 of a TFT unit 2 and is conductive.

The planarization protective layer 3 on the array substrate is, for instance, formed by resin with specific viscosity, and can planarize an irregular structure on the array substrate, protect structures below the planarization protective layer 3 from being eroded, and ensure smooth conduction of the subsequent manufacturing processes of the array substrate.

In at least one embodiment of the present invention, the planarization protective layer 3 may also be conductive. Thus, the planarization protective layer 3 not only can protect the array substrate but also can act as a pixel electrode of the array substrate as the planarization protective layer 3 is electrically connected with the drain electrode 25 of the TFT unit 2. The planarization protective layer 3 made from a conductive material does not require a sputtering process, while can adopt other kinds of processes such as coating and deposition, and hence can effectively ensure safety and productivity.

Moreover, the TFT unit 2 is mainly provided with a channel capable of being conductive under a certain condition in an active layer 24 so as to transmit electrical signals between a source electrode 23 and the drain electrode 25. Light will affect the carrier transportability of the conductive channel in the active layer 24 and hence affect the working effect of the TFT unit 2. Thus, in at least one embodiment of the present invention, a black matrix 11 is arranged corresponding to the active layer 23 of the TFT unit.

The black matrix 11 may be made from a black or dark resin. In the manufacturing process of the black matrix 11, one layer of a light shield material is deposited on a formed passivation layer at first, and hence a plurality of black matrixes 11 of the TFT units 2 are formed by patterning processes including etching. In order to reduce the manufacturing process of the array substrate, black photoresist is preferably adopted to manufacture the black matrixes 11, and corresponding patterns are directly formed by utilization of the photosensitivity of the black photoresist. Compared with the foregoing manufacturing process, the use of additional photoresist can be saved in the manufacturing process of the black matrixes 11.

Sub-pixel units on the array substrate are defined by the black matrixes 11. The sub-pixel units may include color filters. The color filters are, for instance, red, green and blue (RGB) color filters. Light in the color filters may be filtered to respectively obtain red light, green light and blue light.

As customer's requirements on the light transmittance, resolution, power consumption and the like of a display device become higher and higher in recent years, the display device is developed towards high transmittance, high resolution, low power consumption and the like. When the resolution is higher, the size of each pixel unit is smaller. When the side length of the pixel unit is changed from tens of micrometers to more than ten micrometers, obviously, the size of the pixel unit is greatly reduced. In this case, if the width of the black matrixes for defining the pixel units is still unchanged, with respect to the pixel unit, the black matrix will become apparent, and hence the display effect of the display device will be advantageously affected. Thus, the width of the black matrixes shall be correspondingly reduced to ensure the display effect of the display device. Subsequently, the color filters are formed above display areas of corresponding pixel units defined by the black matrixes.

However, the reduced width of the black matrixes may result in the deviation in the cell-assembly between the array substrate and a color filter substrate and hence result in poor phenomena such as light leakage. Thus, the width of the black matrixes disposed on the color filter substrate cannot be reduced at will. In order to overcome the poor phenomena such as light leakage brought by the black matrixes, the black matrixes and the color filters are formed on the array substrate. As the black matrixes are disposed on the array substrate in this case, when the width of the black matrixes is appropriately reduced, the black matrixes can also fully shield structures requiring light shield such as gate lines, data lines and TFT units, and the possibility of the light leakage phenomenon can be reduced as well. Moreover, not only the resolution and the transmittance are improved but also the display effect of the display device is guaranteed. The technology is also known as color filter on array (COA) technology.

In at least one embodiment of the present invention, both the color filters 4 and the TFT units 2 are formed on the same base substrate 1 by COA technology.

As illustrated in FIG. 1, the array substrate further comprises a first insulating layer 7 disposed between the TFT units 2 and the planarization protective layers 3. A first through hole 8 is formed at an area of the first insulating layer corresponding to the drain electrode 25 of a TFT unit 2. The planarization protective layer 3 is electrically connected with the drain electrode 25 of the TFT unit 2 via the first through hole 8.

The planarization protective layer 3 may be of a planar plate structure, a slit structure or other structures. No limitation will be given here in the embodiment of the present invention.

The TFT unit 2 in the array substrate provided by the embodiment as shown in FIG. 1 is a bottom-gate TFT unit, namely the structures of the TFT unit 2, from the bottom up, include: a gate electrode 21, a gate insulating layer 22, a source electrode 24 and a drain electrode 25 arranged on the same layer and insulated from each other, and an active layer 23 configured to connect the source electrode 24 and the drain electrode 25.

Although description is given in the disclosure by taking bottom-gate TFTs as an example, the present invention is not limited thereto. For instance, top-gate TFTs may also be adopted. In the disclosure, bottom-gate TFT shall be interpreted as the general name of bottom-gate TFTs. A so-called bottom-gate TFT refers to this type of TFT in which a gate electrode is disposed below the semiconductor layer of the TFT. Based on the same reason, top-gate TFT shall be interpreted as the general name of top-gate TFTs. A so-called top-gate TFT refers to this type of TFT in which a gate electrode is disposed above the semiconductor layer of the TFT.

As illustrated in FIG. 1, the planarization protective layer 3 is disposed above the TFT unit 2. As the first insulating layer 7 is disposed on the TFT unit 2, here the first insulating layer 7 is generally referred to as a passivation layer. By adoption of the passivation layer process, not only the ability of the display device to resist harsh environment is improved but also the photoelectric parameters and performances of the TFT unit 2 is improved. The passivation layer is made from one selected from insulating materials such as silicon oxide, silicon nitride, hafnium oxide and resin or any combination thereof. In order to achieve the electrical connection between the planarization protective layer 3 and the drain electrode 25, a first through hole 8 running through the first insulating layer 7 may be formed in an area of the first insulating layer 7 corresponding to the drain electrode 25 of the TFT unit 2, so that the planarization protective layer 3 can be electrically connected with the drain electrode 25 via the first through hole 8.

As illustrated in FIG. 1, the black matrix 11 and the color filter 4 may be arranged on the same layer. As the color filter 4 is disposed between the planarization protective layer 3 and the first insulating layer 7, the first through hole 8 must also run through the color filter 4, so that the planarization protective layer 3 can be electrically connected with the drain electrode 25.

Figure 2:
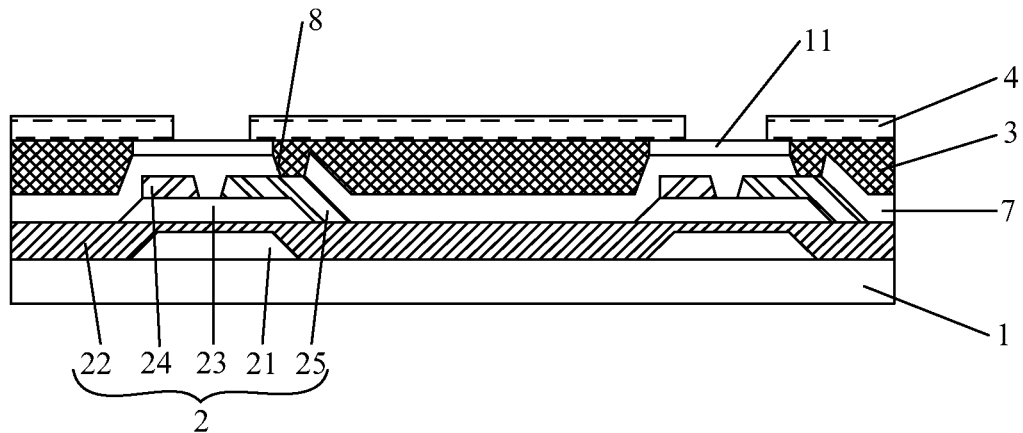
FIG. 2 is a schematic structural view of an array substrate provided by one embodiment of the present invention.

FIG. 2 is a schematic structural view of an array substrate provided by one embodiment of the present invention. As illustrated in FIG. 2, the black matrix 11 and the planarization protective layer 3 may also be arranged on the same layer and are disposed on the first insulating layer 7. The color filter 4 is also disposed on the planarization protective layer 3. The first through hole 8 only needs to run through the first insulating layer 7, and hence the planarization protective layer 3 can be electrically connected with the drain electrode 25.

Figure 3:
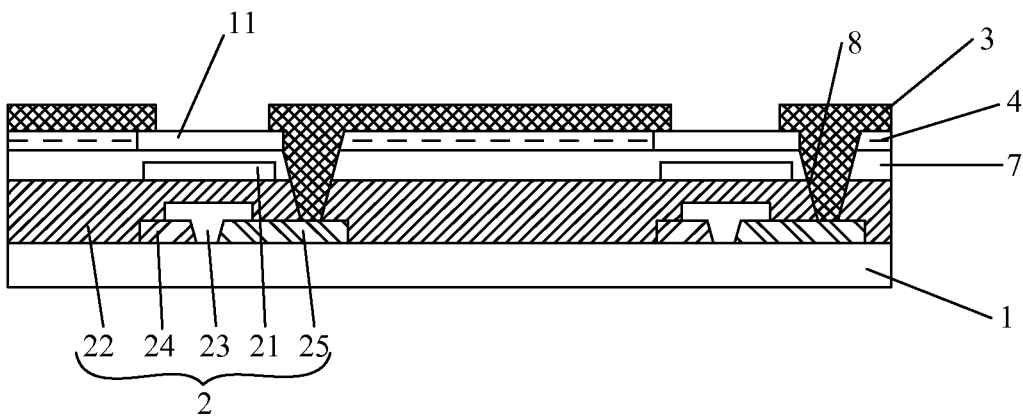
FIG. 3 is a schematic structural view of an array substrate provided by one embodiment of the present invention.
Figure 4:
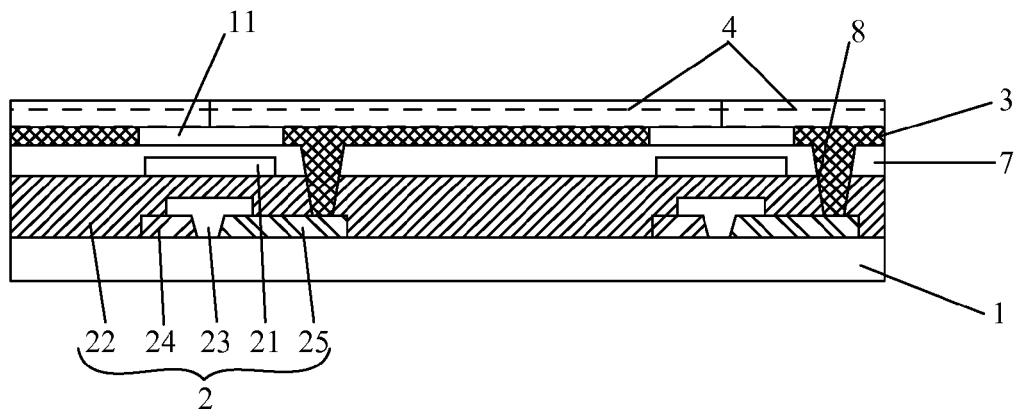
FIG. 4 is a schematic structural view of an array substrate provided by one embodiment of the present invention.

FIGS. 3 and 4 are schematic structural views of an array substrate provided by one embodiment of the present invention. As illustrated in FIG. 3 or 4, the TFT unit 2 adopts top-gate type. The TFT unit 2, from the bottom up, includes: a source electrode 24 and a drain electrode 25 arranged on the same layer and insulated from each other, an active layer 23 configured to connect the source electrode 24 and the drain electrode 25, a gate insulating layer 22 and a gate electrode 21.

In comparison of FIG. 1 with FIG. 3, the parts in FIG. 3 consistent with FIG. 1 are as follows: the black matrix 11 and the color filter 4 arranged on the same layer and the planarization protective layer 3 disposed on the black matrix 11 and the color filter 4 are arranged on the first insulating layer 7 in sequence. The difference is as follows: in order to achieve the electrical connection between the planarization protective layer 3 and the drain electrode 25, a first through hole 8 is formed in areas of the color filter 4, the first insulating layer 7 and the gate insulating layer 22 respectively corresponding to the drain electrode 25 of the TFT unit 2. The first through hole 8 runs through three insulating layers, namely the color filter 4, the first insulating layer 7 and the gate insulating layer, so that the planarization protective layer 3 can be electrically connected with the drain electrode 25.

In comparison of FIG. 2 with FIG. 4, the parts in FIG. 4 consistent with that of FIG. 2 are as follows: the planarization protective layer 3 and the black matrix 11 arranged on the same layer and the color filter 4 disposed on the planarization protective layer 3 and the black matrix 11 are arranged on the first insulating layer 7 in sequence. The difference is as follows: in order to achieve the electrical connection between the planarization protective layer 3 and the drain electrode 25, a first through hole 7 is formed at areas of the first insulating layer 7 and the gate insulating layer 22 respectively corresponding to the drain electrode 25 of the TFT unit 2. The first through hole 7 must run through two insulating layers, namely the first insulating layer 7 and the gate insulating layer 22, so that the planarization protective layer 3 can be electrically connected with the drain electrode 25.

It should be noted that: as the planarization protective layers 3 are equivalent to pixel electrodes of pixel units in some embodiments of the present invention, the planarization protective layers 3 of the pixel units shall be insulated from each other; patterns of the planarization protective layers 3 may be formed by one patterning process; or in the structure of the array substrate as shown in FIG. 2 or 4, the planarization protective layers 3 of the pixel units are insulated from each other by the black matrixes 11; or the planarization protective layers 3 may also be insulated from each other by the additional arrangement of an insulating layer on the black matrixes 11. The embodiments of the present invention are not limited thereto. No further description will be given here.

Figure 5:
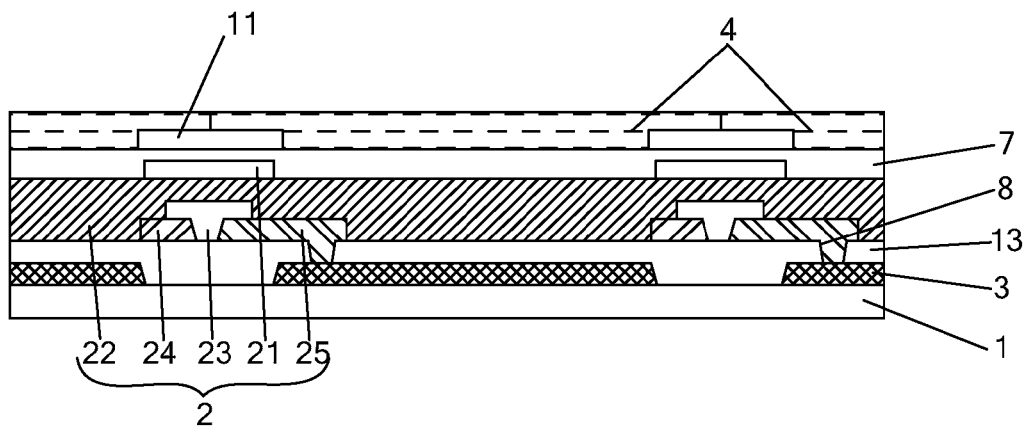
FIG. 5 is a schematic structural view of an array substrate provided by one embodiment of the present invention.

FIG. 5 is a schematic structural view of an array substrate provided by one embodiment of the present invention. As illustrated in FIG. 5, the TFT unit 2 adopts the top-gate type. The color filter 4 and the black matrix 11 are disposed above the TFT unit 2, and the planarization protective layer 3 is disposed below the TFT unit 2. The source electrode 24 and the drain electrode 25 are arranged on the same layer. An insulating layer 13 must be formed between the planarization protective layer 3 and the source electrode 24 and the drain electrode 25 so as to ensure the mutual insulation between the planarization protective layer 3 and the source electrode 24. As the drain electrode 25 of the top-gate TFT unit 2 is disposed on the lowermost layer of the entire structure of the TFT unit 2, in order to achieve the electrical connection between the drain electrode 25 and the planarization protective layer 3, the first through hole 8 must run through the insulating layer 13.

Figure 6:
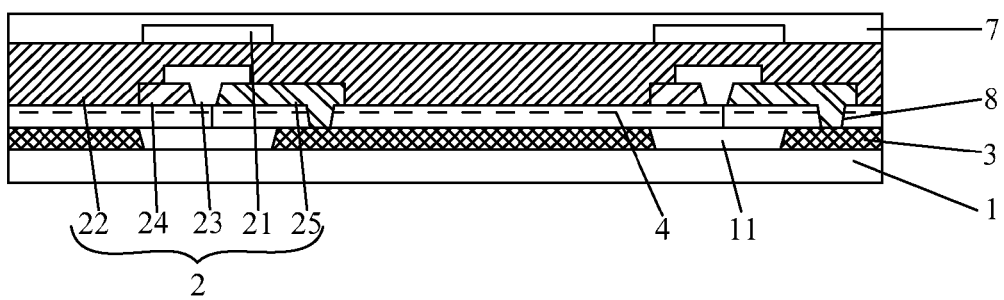
FIG. 6 is a schematic structural view of an array substrate provided by one embodiment of the present invention.

FIG. 6 is a schematic structural view of an array substrate provided by one embodiment of the present invention. The TFT unit 2 adopts the top-gate type. As illustrated in FIG. 6, the color filter 4 and the black matrix 11 may also be disposed beneath the TFT unit 2, and the black matrix 11 and the planarization protective layer 3 are arranged on the same layer. At this point, the color filter 4 and the black matrix 11 may be directly used as an insulating layer between the planarization protective layer 3 and the source electrode 24 and the drain electrode 25 of the TFT unit 2. In order to achieve the electrical connection between the drain electrode 25 and the planarization protective layer, the first through hole 8 must run through the color filter 4. Other array substrate structures may also be adopted. For instance, the color filter 4 and the black matrix 11 may also be disposed below the TFT unit 2 and on the planarization protective layer 3 or disposed below the TFT unit 2 and below the planarization protective layer 3. Some embodiments of the present invention are not limited thereto. No further description will be given here.

Figure 7:
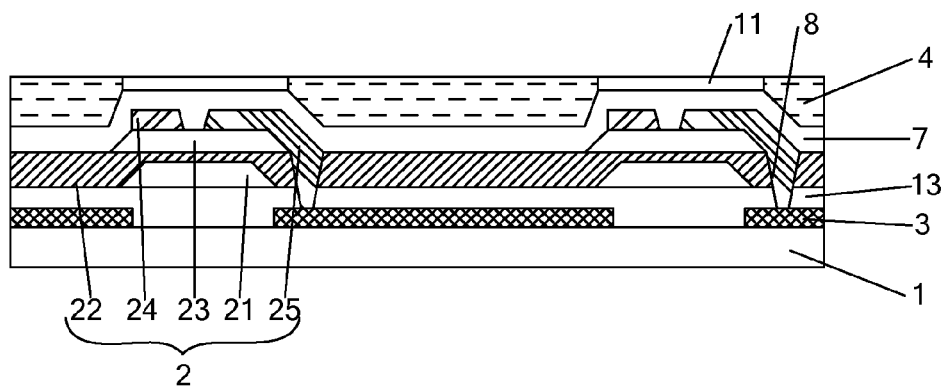
FIG. 7 is a schematic structural view of an array substrate provided by one embodiment of the present invention.

FIG. 7 is a schematic structural view of an array substrate provided by one embodiment of the present invention. As illustrated in FIG. 7, the TFT unit 2 adopts the bottom-gate type; the color filter 4 and the black matrix 11 are disposed above the TFT unit 2; and the planarization protective layer 3 is disposed below the TFT unit 2. As similar to FIG. 5, in order to prevent mutual interference between the planarization protective layer 3 and the gate electrode 21 and hence avoid the influence on the working effect of the array substrate, an insulating layer 13 must be disposed between the gate electrode 21 of the TFT unit 2 and the planarization protective layer 3. Or as similar to FIG. 6, the color filter 4 and the black matrix 11 are disposed beneath the TFT unit 2 and taken as an insulating layer. No further description will be given here. In order to achieve the electrical connection between the drain electrode 25 and the planarization protective layer 3, the first through hole 8 must run through the insulating layer 13 and the gate insulating layer 22. Other kind of array substrate structures may also be adopted. For instance, the color filter 4 and the black matrix 11 may be disposed below the TFT unit 2, and the black matrix 11 and the planarization protective layer 3 are arranged on the same layer; the color filter 4 and the black matrix 11 may also be disposed below the TFT unit 2 and above the planarization protective layer 3; or the color filter 4 and the black matrix 11 are disposed below the TFT unit 2 and below the planarization protective layer 3. No further description will be given here to the specific structure.

In at least one embodiment of the present invention, for instance, the planarization protective layer 3 is disposed above the TFT unit 2, the black matrix 11 and the color filter 4. As illustrated in FIG. 1 or 2, the color filter 4 is disposed between the planarization protective layer 3 and the base substrate 1, so that the planarization protective layer 3 is closer to a liquid crystal layer and hence can better cooperate with the common electrode to drive the deflection of liquid crystals.

It should be noted that: in at least one embodiment of the present invention, both the source electrode 24 and the drain electrode 25 of the TFT unit 2 are arranged on the same layer and formed in the same patterning process. But a TFT unit 2, in which a source electrode 24 and a drain electrode 25 are arranged on different layers, is also applicable to the embodiment of the present invention.

It should be noted that: as the structures as shown in FIGS. 1 to 7 have specific similarity, detailed description will be given below by taking the array substrate as shown in FIG. 1 as an example.

Figure 8:
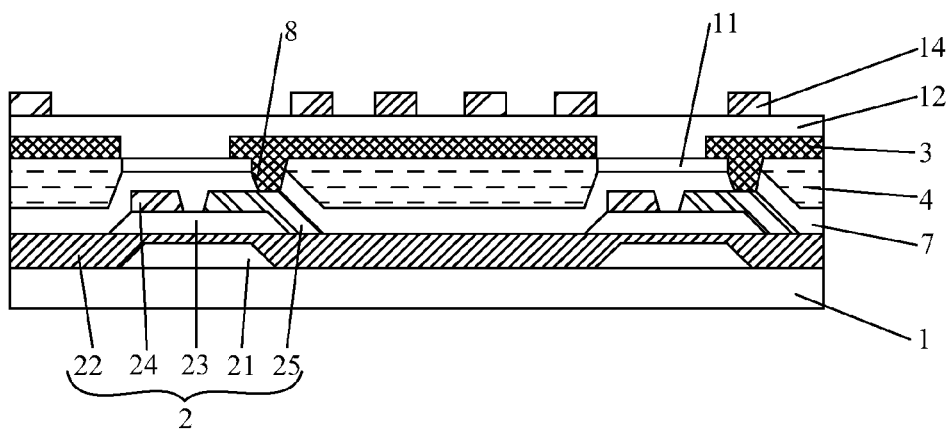
FIG. 8 is a schematic structural view of an array substrate provided by one embodiment of the present invention.

As described above, as the planarization protective layer 3 is connected with the drain electrode 25 of the TFT unit 2 and the planarization protective layer 3 (equivalent to a plate electrode) is made from a transparent conductive material, the planarization protective layer 3 is equivalent to a pixel electrode. The array substrates as shown in FIGS. 1 to 7 are twisted nematic (TN) type array substrates formed in a COA process. In this way, the structure of the array substrate as shown in FIG. 1 is improved. For instance, as illustrated in FIG. 8, the array substrate further comprises common electrodes 14 (equivalent to slit electrodes) cooperating with the planarization protective layers 3 and a third insulating layer 12 disposed between the planarization protective layers 3 and the common electrodes 14. In this case, the array substrate is an advanced super dimension switch (ADS) array substrate formed in a COA process.

The so-called advanced super dimension switch technology is referred to as ADS for short. The core technological features are as follows: a multi-dimensional electric field is formed by electric fields produced at edges of slit electrodes in the same plane and electric fields produced between a slit electrode layer and a plate electrode layer, so that liquid crystal molecules at all directions, which are disposed between slit electrodes and over electrodes in a liquid crystal cell, can rotate, and hence the working efficiency can be improved and the light transmittance can be increased. The ADS technology can improve the image quality of thin-film transistor liquid crystal display (TFT-LCD) products and has the advantages of high resolution, high transmittance, low power consumption, wide viewing angle, high aperture opening ratio, low color difference, no push Mura, etc. For different applications, the improved techniques of the ADS technology include high transmittance I-ADS technology, high aperture-ratio H-ADS technology, high-resolution S-ADS technology and the like.

The common electrode in the above embodiment may be a plate electrode or a slit electrode. The pixel electrode may be also a plate electrode or a slit electrode. Of course, the up-down sequence of the pixel electrode and the common electrode may be reversed. Moreover, both the pixel electrode and the common electrode may be a slit electrode.

Of course, the array substrate provided by the embodiment is also applicable to in-plane switch (IPS) mode. The core technological feature of IPS is as follows: a horizontal electric field is formed by electric fields produced by a slit common electrode and a slit pixel electrode in the same plane. For instance, one part of the planarization protective layer on the same layer is taken as the pixel electrode and one part is taken as the common electrode.

Similarly, the common electrodes 14 cooperating with the planarization protective layers 3 and the third insulating layer 12 disposed between the planarization protective layers 3 and the common electrodes 14 may be added on the basis of the array substrate as shown in FIGS. 2 to 7.

Figure 9:
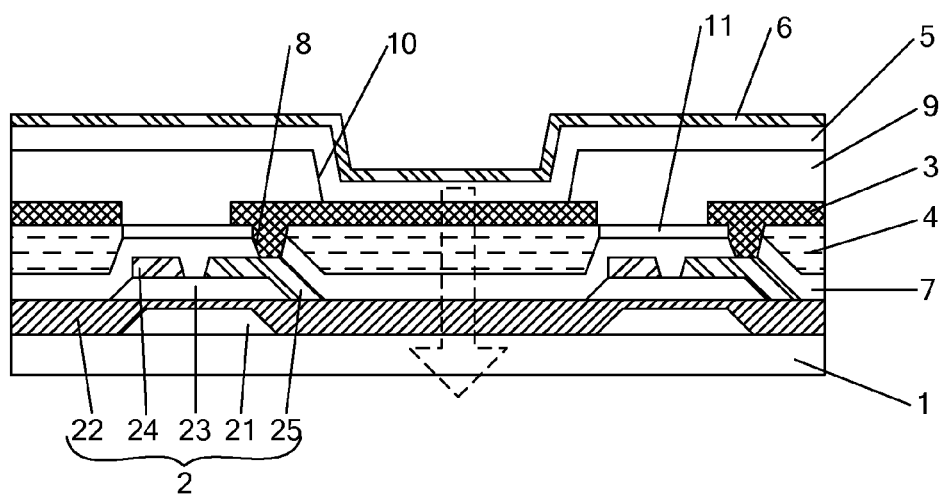
FIG. 9 is a schematic structural view of an array substrate provided by one embodiment of the present invention.

As similar to the first insulating layer 7 and the fourth insulating layer 13, the third insulating layer 12 may also be made from one selected from insulating materials such as silicon oxide, silicon nitride, hafnium oxide and resin or any combination thereof Or as illustrated in FIG. 9, on the basis of the array substrate as shown in FIG. 1, the array substrate further comprises an organic layer 5 and a conductive layer 6 disposed above the planarization protective layer 3, and the planarization protective layer 3 cooperates with the conductive layer 6 to jointly drive the organic layer 5 to emit light. That is to say, in this case, the array substrate is an organic light-emitting diode (OLED) array substrate. The organic layer 5 is, for instance, made from organic semiconductor materials, may be a single layer or a composite layer. When the organic layer 5 is a composite layer, for instance, the organic layer 5 sequentially includes a hole transport layer (HTL), an organic emission layer (EML) and an electron transport layer (ETL) from the anode side to the cathode side.

In the structure of the array substrate as shown in FIG. 9, as the planarization protective layer 3 is connected with the drain electrode 25 of the TFT unit 2 and made from a conductive material, namely the planarization protective layer 3 is equivalent to a metal anode of the organic layer 5, and accordingly the metal anode structure may be saved in the array substrate. Thus, the layer structure of the OLED array substrate is obviously simplified. Therefore, the manufacturing process and the manufacturing difficulty of the OLED array substrate can be reduced, and hence the production yield of the OLED array substrate can be improved.

In general, the light-emitting direction of the OLED array substrate is represented by the dashed arrow as shown in FIG. 9, namely light is emitted from the organic layer 5, runs through the multilayer structure, and is emitted out of the base substrate 1.

The organic layer 5 is, for instance, made from a material or materials capable of emitting white light. In at least one embodiment of the present invention, the conductive layer 6 cooperating with the planarization protective layer 3 to drive the organic layer 5 to emit light, for instance, may be made from a low-cost light-tight material, for example, aluminum (Al). Light emitted by the organic layer 5 may be reflected into the color filter 4, and hence the utilization ratio of the light emitted by the organic layer 5 can be improved.

Meanwhile, the case that the light emitted by the organic layer 5 is reflected by the conductive layer and then its color is changed can also be avoided, and hence the display effect of the display device can be guaranteed.

In addition, because the entire array substrate is not required to emit light for viewers in the working process, a second insulating layer 9 may be disposed in the areas (e.g., areas corresponding to the TFT units 2 and areas covered by the black matrixes 11), which do not require light emission, on the planarization protective layers 3, so as to achieve the insulation between the planarization protective layers 3 and the organic layer 5 and prevent the light emission of the organic layer 5 in these areas. The second insulating layer 9 is provided with openings 10 in areas requiring light emission, namely sub-pixel areas, so that the organic layer 5 can be electrically connected with the planarization protective layers 3 through the openings 10 respectively. As the second insulating layer 9 defines the light-emitting regions, namely the sub-pixel areas, the second insulating layer 9 is also referred to as a pixel define layer. Thus, the areas corresponding to the openings 10 are referred to as light-emitting regions, while the areas covered by the second insulating layer 9 do not emit light.

Similarly, the structures such as the organic layer 5, the second insulating layer 9 and the conductive layer 6, disposed on the planarization protective layers 3, may be added on the basis of the array substrate as shown in FIGS. 2 to 4, so as to form an OLED array substrate. No further description will be given here.

Similar to the first insulating layer 7, the fourth insulating layer 13 and the like, the second insulating layer 9 may also be one selected from insulating materials such as silicon oxide, silicon nitride, hafnium oxide and resin or any combination thereof In the embodiment of the present invention, the planarization protective layer 3 not only has good conductive effect but also has high curability, transmittance, etc. For instance, when the planarization protective layer 3 is taken for an OLED anode, the planarization protective layer 3 not only satisfies the transmittance but also has work function matched with the organic layer(s). Thus, the planarization protective layer 3 is, for instance, made from a transparent conductive resin. The transparent conductive resin may be prepared by the following method: 10 to 50 mass parts of transparent matrix resin and 1 to 20 mass parts of organic acid doped polyaniline are added into 40 to 90 mass parts of toluene and stirred until completely dissolved to form the transparent conductive resin.

Or 10 to 50 mass parts of a transparent matrix resin, 1 to 20 mass parts of organic acid doped polyaniline and 1 to 15 mass parts of crosslinking monomer are added into 40 to 90 mass parts of toluene and stirred until completely dissolved to form the transparent conductive resin.

In addition, nano-scale autimony(Sb)-doped $SnO_2$ may also be uniformly mixed with high molecular polymer monomers, a dispersing agent, a surfactant, etc. to form the transparent conductive resin for preparing the planarization protective layer 3.

Conductive particles not only can use nano-scale autimony-doped $SnO_2$ but also can adopt nano-scale conductive particles such as nano-scale indium tin oxide (ITO) or nano silver. In general, the size of the conductive particles is from 20 to 50 nm.

In addition, the resistivity of the finally formed planarization protective layer 3 can be changed by adjusting the curing temperature of the resin, the size of the conductive particles, light illumination and other factors, and hence good electrical connection between the planarization protective layer 3 and the drain electrode 25 and the organic layer 5 can be guaranteed.

Moreover, at least one embodiment of the present invention further provides a display device, which comprises any foregoing array substrate. The display device may be: any product or component with display function such as a liquid crystal display (LCD) panel, e-paper, an OLED panel, an LCD TV, an LCD, a digital picture frame, a mobile phone and a tablet PC.

Figure 10:
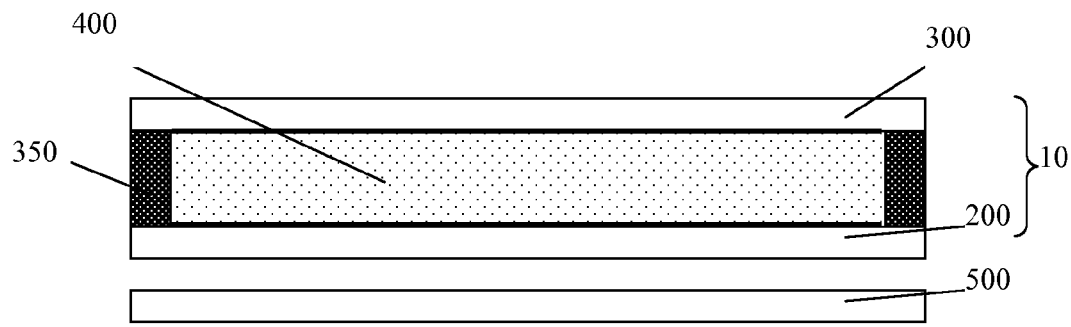
FIG. 10 is a schematic diagram of a display device provided by one embodiment of the present invention.

One example of the display device is an LCD device. FIG. 10 is a schematic diagram of a display device provided by one embodiment of the present invention. The display device comprises: an array substrate 200 and an opposing substrate 300 which are arranged opposite to each other to form a liquid crystal cell through a sealant 350, and liquid crystal materials 400 are filled in the liquid crystal cell. A pixel electrode of each sub-pixel unit of the array substrate is configured to apply an electric field to control the rotation degree of the liquid crystal materials so as to perform display operation. In some examples, the LCD device further comprises a backlight 500 configured to provide backlight for the array substrate.

Another example of the display device is an OLED display device. Laminated organic luminescent materials are formed on the array substrate and isolated from the outside atmosphere via an encapsulation layer. A pixel electrode of each sub-pixel unit is taken as an anode or a cathode and configured to drive the organic luminescent materials to emit light so as to perform display operation.

One embodiment of the present invention provides a method for manufacturing an array substrate, which comprises: forming TFT units provided with drain electrodes, color filters and planarization protective layers electrically connected with the drain electrodes of the TFT units.

Thus, the array substrate as shown in FIGS. 1 to 7 in which the planarization protective layer 3 is electrically connected with the drain electrode 25 may be formed. The array substrate provided by some embodiments of the present invention at least may be realized in the seven structures as shown in FIGS. 1 to 7. That is to say, the drain electrode 25 of the TFT unit 2 not only can be disposed above the planarization protective layer 3 but also can be disposed below the planarization protective layer 3. Moreover, the TFT unit 2 may adopt the bottom-gate type and may also adopt the top-gate type.

Figure 11:
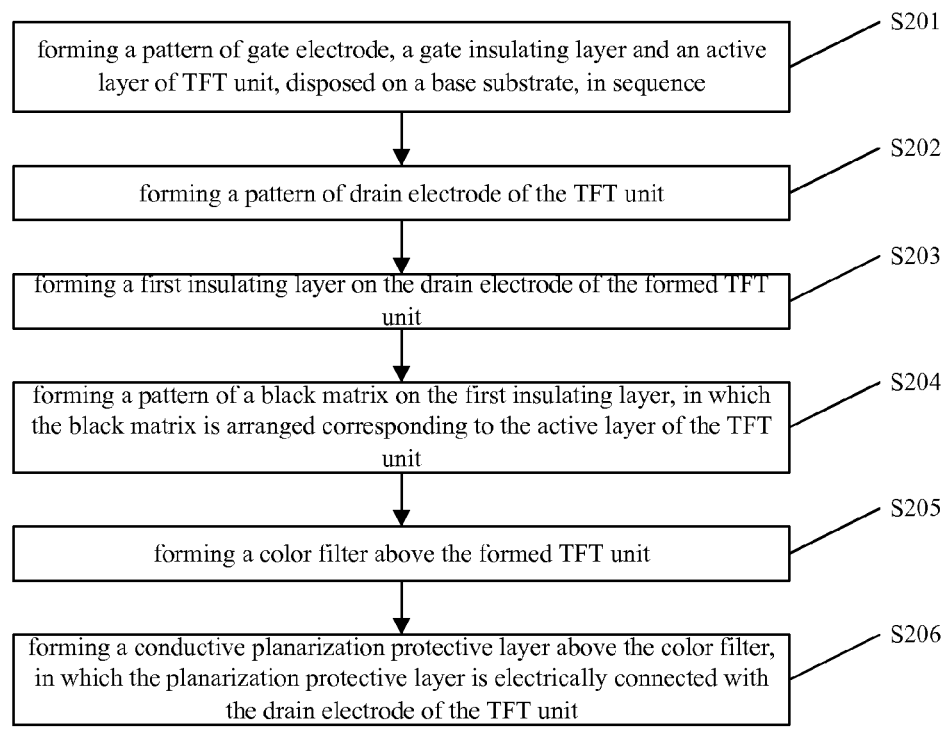
FIG. 11 is a flowchart of a method for manufacturing an array substrate, provided by one embodiment of the present invention.

For instance, if the array substrate as shown in FIG. 1 is formed, as illustrated in FIG. 11, the manufacturing method comprises the following steps.

Step S201: forming patterns of gate electrodes, a gate insulating layer and active layers of TFT units, disposed on a base substrate, in sequence.

Figure 12:
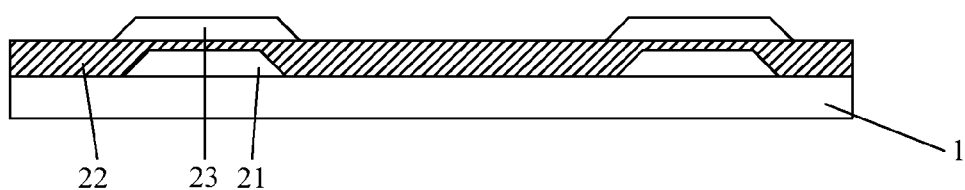
FIG. 12 is a schematic structural view of an array substrate provided by one embodiment of the present invention.

As illustrated in FIG. 12, the TFT unit 2 sequentially includes a gate electrode 21, a gate insulating layer 22 disposed on the gate electrode 21 and an active layer 23 disposed on the gate insulating layer 22 from the bottom up. Thus, in the manufacturing process, the gate electrode 21, the gate insulating layer 22 and the active layer 23 are formed on the array substrate in sequence.

It should be noted that: the structures such as gate lines (not shown in the figure) on the base substrate are also integrally formed when the gate electrodes 21 of the TFT units 2 are formed.

Step S202: forming patterns of drain electrodes of the TFT units.

Figure 13:
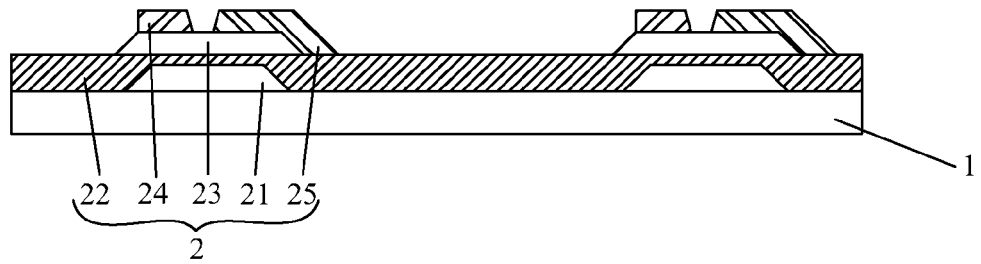
FIG. 13 is a schematic structural view of an array substrate provided by one embodiment of the present invention.
Figure 14:
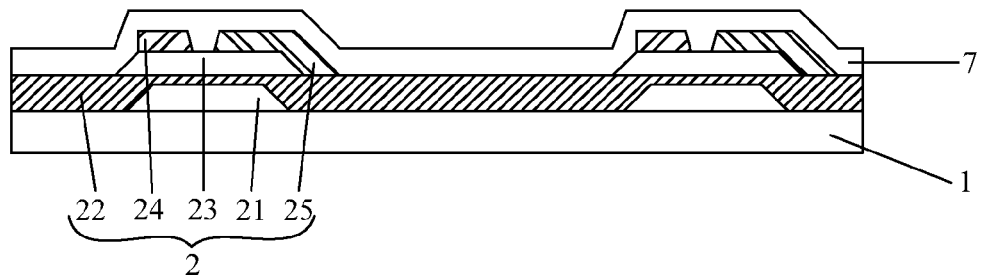
FIG. 14 is a schematic structural view of an array substrate provided by one embodiment of the present invention.

The TFT unit 2 further includes a source electrode 24 in addition to the structures such as the gate electrode 21, the gate insulating layer 22, the active layer 23 and the drain electrode 25. In the embodiment of the present invention, the source electrode 24 and the drain electrode 25 of the TFT unit 2 are arranged on the same layer. Thus, as illustrated in FIG. 13, the source electrode 24 may be formed when the drain electrode 25 is formed in the step S202.

If the source electrode 24 and the drain electrode 25 are not arranged on the same layer, the source electrode 24 may be formed before or after the drain electrode 25 is formed according to actual condition. No limitation will be given here in the embodiment of the present invention.

Step S203: forming a first insulating layer on the drain electrodes of the formed TFT units.

After the step S202, the first insulating layer 7 is formed on the drain electrodes of the TFT units by coating, deposition or the like. Thus, the first insulating layer 7 is disposed on the TFT units 2. At this point, the first insulating layer 7 is generally referred to as a passivation layer. By adoption of the passivation layer process, not only the ability of the display device to resist harsh environment is improved but also the photoelectric parameters and performances of the TFT units 2 is improved. But the passivation layer is made from one selected from insulating materials such as silicon oxide, silicon nitride, hafnium oxide and resin or any combination thereof.

Step S204: forming patterns of black matrixes on the first insulating layer, in which the black matrixes are arranged corresponding to the active layers of the TFT units.

Figure 15:
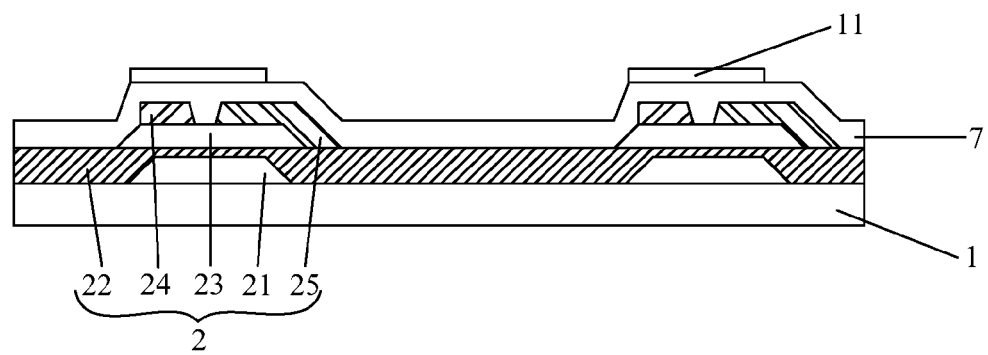
FIG. 15 is a schematic structural view of an array substrate provided by one embodiment of the present invention.

One layer of a light shield material is formed on the pattern of the formed first insulating layer by coating, deposition or the like. Subsequently, as illustrated in FIG. 15, a plurality of black matrixes 11 corresponding to the active layers 23 of the TFT units 2 are formed by patterning processes including etching. In order to simplify the manufacturing process of the array substrate, black photoresist is preferably selected to prepare the black matrixes 11. As the black matrixes are directly manufactured by utilization of the photosensitivity of the black photoresist, compared with the above method, additional photoresist can be saved in the manufacturing process of the black matrixes 11.

It should be noted that: in order to ensure that conductive channels formed in the active layers 23 will not be irradiated by light in the working process of the TFT units, the black matrixes 11 generally correspond to all the active layers 23.

Step S205: forming color filters above the formed TFT units.

Figure 16:
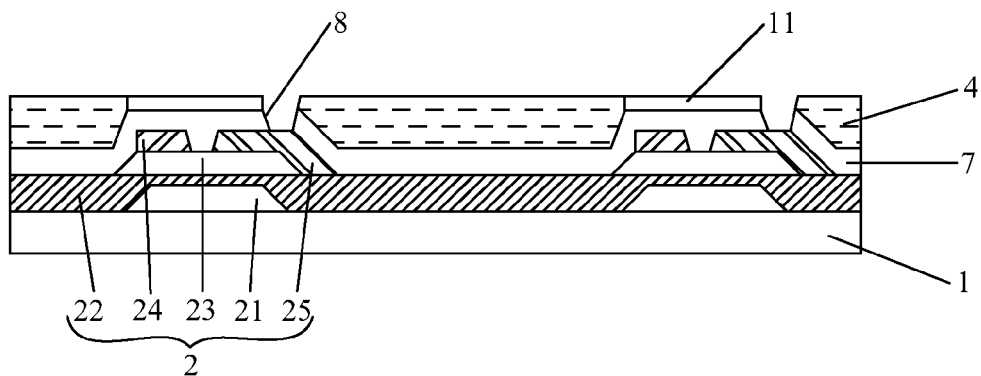
FIG. 16 is a schematic structural view of an array substrate provided by one embodiment of the present invention.

Moreover, after the color filters 4 are formed, first through holes 8 must also be formed in the areas, corresponding to the drain electrodes 25 of the TFT units 2, by patterning process. As illustrated in FIG. 16, the first through hole 8 runs through the color filter 4 and the first insulating layer 7 to ensure the electrical connection between the subsequently formed planarization protective layer 3 and the drain electrode 25.

Step S206: forming conductive planarization protective layers on the color filters, in which the planarization protective layers are electrically connected with the drain electrodes of the TFT units.

As illustrated in FIG. 17, on the basis of the step S204, the planarization protective layers 3 are formed on the drain electrodes of the formed TFT units 2. The planarization protective layer 3 may be electrically connected with the drain electrode 25 of the TFT unit 2 via the first through hole 8 running through the color filter 4 and the first insulating layer 7.

In order to ensure that the planarization protective layer 3 not only has good conductivity but also has high curing property, transmittance, etc., in the embodiment of the present invention, for instance, the planarization protective layer 3 may be made from a transparent conductive resin. For instance, the transparent conductive resin may be prepared by the following method: 10 to 50 mass parts of transparent matrix resin and 1 to 20 mass parts of organic acid doped polyaniline are added into 40 to 90 mass parts of toluene and stirred until completely dissolved to form the transparent conductive resin.

Or 10 to 50 mass parts of transparent matrix resin, 1 to 20 mass parts of organic acid doped polyaniline and 1 to 15 mass parts of crosslinking monomer are added into 40 to 90 mass parts of toluene and stirred until completely dissolved to form the transparent conductive resin.

Or 10 to 50 mass parts of transparent matrix resin, 1 to 20 mass parts of organic acid doped polyaniline, 1 to 15 mass parts of crosslinking monomer and 0.1 to 1 mass part of curing initiator are added into 40 to 90 mass parts of toluene and stirred until completely dissolved to form the transparent conductive resin.

In addition, nano-scale autimony-doped $SnO_2$ may also be uniformly mixed with high molecular polymer monomers, a dispersing agent, a surfactant, etc. to form the transparent conductive resin for preparing the planarization protective layer 3.

For instance, nano-scale conductive particles, high molecular polymer monomers, a dispersing agent, a surfactant, etc. may be uniformly mixed to form the transparent conductive resin for preparing the planarization protective layer 3 by coating, deposition and other means.

The nano-scale conductive particles not only can use nano-scale autimony-doped $SnO_2$ but also can adopt nano-scale ITO, nano silver, etc.

As described above, as the planarization protective layer 3 is connected with the drain electrode 25 of the TFT unit 2 and made from a transparent conductive material, the planarization protective layer 3 is equivalent to a pixel electrode. Obviously, the array substrate as shown in FIG. 1 is an array substrate in a TN type display panel formed in a COA process. On the basis, the structure of the array substrate as shown in FIG. 1 may be improved. For instance, as illustrated in FIG. 8, common electrodes 14 cooperating with the planarization protective layers 3 and a third insulating layer 12 disposed between the planarization protective layers 3 and the common electrodes 14 are also formed on the array substrate on the basis of the array substrate as shown in FIG. 1. In this case, the array substrate is an array substrate in an ADS display panel formed in a COA process.

Moreover, an array substrate in an OLED display panel may be also formed on the basis of the array substrate as shown in FIG. 1. As illustrated in FIG. 18, after the step S205, the method further comprises:

Step S301: forming a second insulating layer on the planarization protective layers, in which the second insulating layer is provided with openings so that the organic layers are electrically connected with the planarization protective layers through the openings.

Similar to the first insulating layer 7, the second insulating layer 9 may also be made from one selected from insulating materials such as silicon oxide, silicon nitride, hafnium oxide and resin or any combination thereof. As illustrated in FIG. 19, as the second insulating layer 9 is also subjected to a patterning process to form openings 10. For instance, photoresist may be adopted to form the second insulating layer 9. By utilization of the photosensitivity of the photoresist, additional photoresist can be saved in the manufacturing process of the openings 10. Thus, the manufacturing process of the array substrate can be simplified and the manufacturing cost of the array substrate can be reduced.

In the embodiment of the present invention, as illustrated in FIG. 19, the areas corresponding to the openings 10 are light-emitting regions in the working process of the array substrate, and the second insulating layer 9 retained on the circumference of the openings 10 belongs to non-light-emitting regions. Thus, the second insulating layer 9 is also referred to as a pixel define layer.

Step S302: forming an organic layer on the formed planarization protective layers and forming a conductive layer on the organic layer, so that the planarization protective layers can be electrically connected with the organic layer and cooperate with the conductive layer to jointly drive the organic layer to emit light.

After the step S302, the structure of the array substrate is as shown in FIG. 9.

For instance, the organic layer 5 includes an HTL, an EML and an ETL. When the voltage between the planarization protective layer 3 and the conductive layer 6 is appropriate, positive holes in the HTL and negative charges in the ETL will be combined in the EML to drive the EML to emit light.

It should be noted that: because an organic materials suitable for electron transport may not be suitable for hole transport, the ETL and the HTL of an OLED shall select different organic materials or organic materials doped with different impurities. Currently, the most commonly used materials for preparing the ETL must have high film forming stability, thermal stability and good electron transport property and generally adopt fluorescent dye compounds such as anthracene diazole derivatives, naphthalene ring-containing derivatives, 1-naphthyl, 3-methylphenyl and the like. But the materials of the HTL belong to an aromatic amine fluorescent compound, e.g., 1-naphthyl and other organic materials.

The material of the organic layer 5 preferably have strong fluorescence property in a solid state, good carrier transport property, good thermal stability and chemical stability, high quantum efficiency and vacuum deposition property, and for instance, may adopt 8-hydroxyquinoline aluminum salt.

For instance, the organic layer 5 capable of emitting white light may be selected.

For instance, the conductive layer 6 is formed by vapor deposition, sputtering or the like way. In the embodiment of the present invention, the conductive layer 6 cooperating with the planarization protective layers 3 to drive the organic layer 5 to emit light is made from an opaque material with low cost and smooth surface. Thus, the light emitted by the organic layer 5 can be prevented from being emitted from one side of the conductive layer 6, while the light utilization of the array substrate can be reduced.

Moreover, if the light emitted by the organic layer 5 is white light, the conductive layer 6 is preferably made from a metal with a white smooth surface, e.g., aluminum. Thus, the case that the light emitted by the organic layer 5 is reflected by the conductive layer 6 and then its color is changed can be prevented, and hence the display effect of the display device can be guaranteed.

The planarization protective layers in the array substrate manufactured by the manufacturing method are made from a transparent conductive resin. The planarization protective layers are electrically connected with the drain electrodes of the TFT units and the organic layer and cooperating with the conductive layer to jointly drive the organic layer to emit light. Thus, the metal anode structure can be saved in the array substrate, and hence the layer structure of the array substrate can be obviously simplified. Therefore, the manufacturing process of the array substrate can be simplified and the manufacturing difficulty can be reduced, and hence the production yield of the array substrate can be improved.

Moreover, the manufacturing methods of the array substrates as shown in FIGS. 2 to 7 can be deducted from the method for manufacturing the array substrate as shown in FIG. 11, as described below.

For instance, the difference between FIGS. 2 and 1 is that the TFT unit 2 in FIG. 2 is of the top-gate type. As seen from the manufacturing process as shown in FIG. 11, the manufacturing process of the array substrate as shown in FIG. 2 is briefly described as below.

The top-gate TFT unit 2, from the bottom up, includes: a source electrode 24 and a drain electrode 25 arranged on the same layer and insulated from each other, an active layer 23 configured to connect the source electrode 24 and the drain electrode 25, a gate insulating layer 22 and a gate electrode 21. Thus, the structures of the TFT unit 2 such as the drain electrode 25, the source electrode 24, the active layer 23, the gate insulating layer 22 and the gate electrode 21 must be formed on the base substrate at first. Similarly, the drain electrode 25 and the source electrode 24 may be formed on the same layer or may be formed on different layers.

Subsequently, a first insulating layer 7 is formed on the TFT units 2, and black matrixes 11 are formed on the first insulating layer 7 corresponding to the active layers 23. Subsequently, in order to achieve the electrical connection between the planarization protective layers 3 and the drain electrodes 25 disposed at the bottom, first through holes 8 are formed in the first insulating layer 7 and the gate insulating layers 22. Finally, the conductive planarization protective layers 3 are formed. Meanwhile, the planarization protective layers 3 are also filled in the first through holes 8 so as to be electrically connected with the drain electrodes 25. Thus, the array substrate as shown in FIG. 2 may be formed.

As illustrated in FIGS. 1 and 2, the planarization protective layers 3 are all disposed above the drain electrodes 25. Similarly, the manufacturing method with different sequences may also be considered, so that the planarization protective layers 3 are disposed below the drain electrodes 25. No further description will be given here. Here, the first insulating layer 7 is formed above the planarization protective layers 3, and the first through holes 8 are formed in the areas of the first insulating layer 7 corresponding to the drain electrodes 25 of the TFT units 2, so that the planarization protective layers 3 are electrically connected with the drain electrodes 25 via the first through holes 8.

Similarly, common electrodes 14 cooperating with the planarization protective layers 3 and a third insulating layer 12 disposed between the planarization protective layers 3 and the common electrodes 14 may be added on the basis of the array substrate as shown in FIGS. 2 to 7 to form an ADS mode array substrate.

Moreover, similar to the steps as shown in FIG. 18, the structures such as the second insulating layer 8, the organic layer 5 and the conductive layer 6 may also be added on the basis of the array substrate as shown in FIG. 3 to form an OLED mode array substrate. No further description will be given here.

The foregoing is only the preferred embodiments of the present invention and not intended to limit the scope of protection of the present invention. The scope of protection of the present invention should be defined by the appended claims.

The application claims priority to the Chinese patent application No. 201310741375.9 submitted on Dec. 27, 2013. The disclosure content of the Chinese patent application is enirely incorporated by reference herein as part of the application.

The invention claimed is:

1. An array substrate, comprising a base substrate and a thin-film transistor (TFT) unit, a color filter and a planarization protective layer disposed on the base substrate, wherein the planarization protective layer is electrically connected with a drain electrode of the TFT unit and is conductive, the planarization protective layer is made from a transparent conductive resin.

2. The array substrate according to claim 1, further comprising a first insulating layer disposed between the TFT unit and the planarization protective layer, a first through hole formed at an area of the first insulating layer corresponding to the drain electrode of the TFT unit, the planarization protective layer electrically being connected with the drain electrode of the TFT unit via the first through hole.

3. The array substrate according to claim 2, further comprising a black matrix disposed on the first insulating layer, the black matrix being arranged corresponding to an active layer of the TFT unit.

4. The array substrate according to claim 3, further comprising: an organic layer and a conductive layer disposed on the planarization protective layer, the planarization protective layer cooperating with the conductive layer to jointly drive the organic layer to emit light.

5. The array substrate according to claim 4, wherein a second insulating layer is formed on the planarization protective layer and provided with an opening; and the organic layer is electrically connected with the planarization protective layer through the opening.

6. The array substrate according to claim 3, further comprising a common electrode cooperating with the planarization protective layer and a third insulating layer disposed between the planarization protective layer and the common electrode.

7. The array substrate according to claim 1, wherein the color filter is disposed between the planarization protective layer and the TFT unit.

8. The array substrate according to claim 1, further comprising: an organic layer and a conductive layer disposed on the planarization protective layer, the planarization protective layer cooperating with the conductive layer to jointly drive the organic layer to emit light.

9. The array substrate according to claim 8, wherein a second insulating layer is formed on the planarization protective layer and provided with an opening; and the organic layer is electrically connected with the planarization protective layer through the opening.

10. The array substrate according to claim 1, further comprising a common electrode cooperating with the planarization protective layer and a third insulating layer disposed between the planarization protective layer and the common electrode.

11. A display device, comprising the array substrate according to claim 1.

12. A method for manufacturing an array substrate, comprising:

forming a thin film transistor (TFT) unit having a drain electrode, a color filter and a planarization protective layer electrically connected with the drain electrode of the TFT unit, wherein the planarization protection layer is made of transparent conductive resin.

13. The manufacturing method according to claim 12, further comprising:

forming a pattern of the drain electrode of the TFT unit;

forming a color filter on the formed TFT unit; and forming the conductive planarization protective layers on the color filter and electrically connected with the drain electrode of the TFT unit.

14. The manufacturing method according to claim 13, further comprising:

forming a first insulating layer on the drain electrode of the formed TFT unit and forming a first through hole at an area of the first insulating layer corresponding to the drain electrode of the TFT unit, so that the planarization protective layer is electrically connected with the drain electrode via the first through hole; or forming a first insulating layer on the planarization protective layer and forming a first through hole at an area of the first insulating layer corresponding to the drain electrode of the TFT unit, so that the planarization protective layer is electrically connected with the drain electrode via the first through hole.

15. The manufacturing method according to claim 14, further comprising:

forming a pattern of a black matrix on the first insulating layer, the black matrix being arranged corresponding to an active layer of the TFT unit.

16. The manufacturing method according to claim 13, further comprising:

forming an organic layer on the formed planarization protective layer and forming a conductive layer on the organic layer, so that the planarization protective layer is electrically connected with the organic layer and cooperates with the conductive layer to jointly drive the organic layer to emit light.

17. The manufacturing method according to claim 16, wherein a second insulating layer is formed on the planarization protective layer and provided with an opening, so that the organic layer is electrically connected with the planarization protective layer through the opening.

18. The manufacturing method according to claim 13, wherein a common electrode and a third insulating layer disposed between the planarization protective layer and the common electrode are formed on the formed planarization protective layer.

* * * * *